United States Patent
Wang

(10) Patent No.: US 8,965,552 B2
(45) Date of Patent: Feb. 24, 2015

(54) METHOD AND A DEVICE FOR TITLING

(75) Inventor: Fengguo Wang, Beijing (CN)

(73) Assignee: Beijing Boe Optoelectronics Technology Co., Ltd., Beijing (CN)

(*) Notice: Subject to any disclaimer, the term of this patent is extended or adjusted under 35 U.S.C. 154(b) by 429 days.

(21) Appl. No.: 13/529,320

(22) Filed: Jun. 21, 2012

(65) Prior Publication Data

US 2012/0324711 A1 Dec. 27, 2012

(30) Foreign Application Priority Data

Jun. 21, 2011 (CN) .......................... 2011 1 0167329

(51) Int. Cl.
*G06F 19/00* (2011.01)
*G02F 1/13* (2006.01)
*G03F 9/00* (2006.01)

(52) U.S. Cl.
CPC ................ *G02F 1/13* (2013.01); *G02F 1/1303* (2013.01); *G03F 9/00* (2013.01)
USPC ........... 700/114; 700/115; 700/116; 700/160; 700/186; 700/195; 29/603.04; 29/603.05; 29/854; 29/860

(58) Field of Classification Search
CPC .......... G02F 1/13; G02F 1/1303; G03F 9/708
USPC ............. 700/95–96, 114–116, 160, 186, 195; 29/603.04–603.05, 854, 857, 860
See application file for complete search history.

(56) References Cited

U.S. PATENT DOCUMENTS

| | | | | |
|---|---|---|---|---|
| 4,653,864 A | * | 3/1987 | Baron et al. | 349/156 |
| 4,719,586 A | * | 1/1988 | Moyer et al. | 702/84 |
| 5,005,277 A | * | 4/1991 | Uemura et al. | 29/407.04 |
| 5,186,453 A | * | 2/1993 | Kuhnert | 271/270 |
| 5,379,139 A | * | 1/1995 | Sato et al. | 349/155 |
| 5,381,339 A | * | 1/1995 | Yoko et al. | 700/112 |
| 5,917,726 A | * | 6/1999 | Pryor | 700/95 |
| 7,275,577 B2 | * | 10/2007 | Lee et al. | 156/351 |
| 7,515,981 B2 | * | 4/2009 | Ryznar et al. | 700/95 |
| 7,769,484 B2 | * | 8/2010 | Senda et al. | 700/179 |
| 2004/0095546 A1 | | 5/2004 | Lee et al. | |
| 2004/0241340 A1 | | 12/2004 | Sato et al. | |

(Continued)

FOREIGN PATENT DOCUMENTS

| | | |
|---|---|---|
| CN | 1575439 A | 2/2005 |
| CN | 1865950 A | 11/2006 |

(Continued)

OTHER PUBLICATIONS

First Chinese Office Action dated Nov. 1, 2013, Appln. No. 201110167329.3.

(Continued)

*Primary Examiner* — Ramesh Patel
(74) *Attorney, Agent, or Firm* — Ladas & Parry LLP

(57) ABSTRACT

The present disclosure provides a method and a device for titling, which can achieve automatic correction when deviation occurs between a real titling position of a product to be titled and a preset titling position, so as to avoid an ID shift phenomenon, and thus ensure accuracy of titling positions and improve titling efficiency. The titling method provided in the present disclosure comprises: determining a real titling position of a product to be titled; comparing the real titling position with a preset titling position; and titling the product to be titled in accordance with the comparison result.

8 Claims, 4 Drawing Sheets

(56) References Cited

U.S. PATENT DOCUMENTS

| | | | |
|---|---|---|---|
| 2008/0221721 A1* | 9/2008 | Reed et al. | .................... 700/109 |
| 2009/0059195 A1 | 3/2009 | Sato et al. | |
| 2011/0113624 A1 | 5/2011 | Harada | |
| 2013/0325155 A1* | 12/2013 | Ryznar et al. | ................... 700/95 |

FOREIGN PATENT DOCUMENTS

| | | | |
|---|---|---|---|
| JP | 05-291793 A | 11/1993 | |
| JP | 11-101838 A | 4/1999 | |
| JP | 2008-175846 A | 7/2008 | |
| KR | 20040043204 A | 5/2004 | |
| KR | 1020050039184 A | 4/2005 | |

OTHER PUBLICATIONS

KIPO Office Action dated Nov. 27, 2013; Appln. No. 10-2012-0066822.

Korean Office Action dated May 30, 2014; Appln. No. 10-2012-0066822.

Extended European Search Report dated Jan. 28, 2014; Appln. No. 12172870.3-1903 / 2538267.

* cited by examiner

| No. | X | Y | No. | X | Y | No. | X | Y |
|---|---|---|---|---|---|---|---|---|
| 1 | -624.5 | 526 | 8 | -624.3 | 159.1 | 15 | -624.3 | -207.8 |
| 2 | -442.1 | 526 | 9 | -442.1 | 159.1 | 16 | -442.1 | -207.8 |
| 3 | -259.9 | 526 | 10 | -259.9 | 159.1 | 17 | -259.9 | -207.8 |
| 4 | -77.7 | 526 | 11 | -77.7 | 159.1 | 18 | -77.7 | -207.8 |
| 5 | 107.9 | 526 | 12 | 107.9 | 159.1 | 19 | 107.9 | -207.8 |
| 6 | 290.1 | 526 | 13 | 290.1 | 159.1 | 20 | 290.1 | -207.8 |
| 7 | 472.3 | 526 | 14 | 472.3 | 159.1 | 21 | 472.3 | -207.8 |

Fig. 5

| Camera1 | | | Camera2 | | | Camera3 | | |
|---|---|---|---|---|---|---|---|---|
| Stand | Measure | Diff | Stand | Measure | Diff | Stand | Measure | Diff |
| 2390 | 2494 | -104 | 2557 | 1918 | 639 | 2557 | 2491 | 66 |
| 2390 | 2914 | -524 | 2557 | 1532 | 1025 | 2557 | 2519 | 38 |
| 2390 | 2991 | -601 | 2557 | 1538 | 1039 | 2557 | 2451 | 106 |
| 2390 | 2774 | -384 | 2557 | 1587 | 970 | 2557 | 2431 | 126 |
| 2390 | 2462 | -72 | 2557 | 1865 | 692 | 2557 | 2497 | 60 |
| 2390 | 2854 | -464 | 2557 | 1530 | 1027 | 2557 | 2503 | 54 |
| 2390 | 2894 | -504 | 2557 | 1539 | 1018 | 2557 | 2449 | 108 |
| 2390 | 2824 | -434 | 2557 | 1527 | 1030 | 2557 | 2431 | 126 |
| 2390 | 2874 | -484 | 2557 | 1458 | 1099 | 2557 | 2508 | 49 |
| 2390 | 2803 | -413 | 2557 | 1532 | 1025 | 2557 | 2386 | 171 |

Fig. 6

METHOD AND A DEVICE FOR TITLING

CROSS REFERENCE TO RELATED APPLICATIONS

This application claims the benefit of Chinese Patent Application No. 201110167329.3 filed on Jun. 21, 2011, the entire disclosure of which is incorporated herein by reference.

FIELD OF THE INVENTION

The present disclosure relates to liquid crystal displays (LCD), especially to a method and a device for titling.

BACKGROUND OF THE INVENTION

In an existing titler (titling device) for the fifth-generation TFT-LCD (Thin-Film Transistor Liquid Crystal Display) production line, a substrate (glass) is mechanically positioned by the device and is titled by using fixed coordinate points. That is, after a substrate is loaded into a titler, the titler automatically performs vacuum-pumping; if the vacuum-pumping has no problem, then the titler will perform mechanical three point positioning to the substrate; after the positioning, the titler titles the substrate according to preset coordinate position parameters; and if the substrate loaded into the titler has a little shift but does not deviate from the vacuum line of the titler, then the titler will take the substrate's position as normal, and the titling steps will continue. Thus, there will be a phenomenon of a product identification (ID) shift, i.e., deviation between the substrate's ID position and a designated position.

At present, in order to adjust the above mentioned deviation, an operator has to do manual adjustment by manually measuring the actual deviation, confirming ID position, confirming position parameters, and then modifying the preset coordinate for the ID in the titler so as to avoid the ID shift phenomenon. As a result, a lot of time is needed, and titling efficiency is very low.

FIG. 1 is a schematic view of the existing titler that titles a substrate by using ID heads. The titler operates automatically to mechanically align a substrate with a movement controlled chuck 2 after the substrate (Glass) 1 is loaded. After confirming the position, the titler conducts vacuum-pumping. After the vacuum has been properly loaded, the titler performs mechanical three-point positioning. Subsequently, ID heads 4 provided on an ID head moving bracket 3 in the titler perform fixed-point titling on the substrate 1 in accordance with preset coordinates. If a small deviation is caused during the loading of the substrate 1, but the substrate 1 does not deviate from the vacuum line, then the titler will still perform titling in accordance with the preset coordinates, and thus an ID shift phenomenon will occur.

In summary, the titling device (titler) used for the fifth-generation TFT-LCD production line of the prior art adopts fixed-point titling in production practice, and therefore, when deviation occurs between a desired titling position of a product to be titled and a titling position preset in the titler, the titling device can not make automatic correction, and thus a product ID shift phenomenon occurs.

SUMMARY OF THE INVENTION

The embodiments of the present disclosure provide a method and a device for titling, which can achieve automatic correction when deviation occurs between a desired titling position of a product to be titled and a preset titling position, so as to avoid ID shift, and thus ensure accuracy of titling positions and improve titling efficiency.

A titling method provided by an embodiment of the present disclosure comprises: determining a real titling position of a product to be titled; comparing the real titling position with a preset titling position; and titling the product to be titled in accordance with the comparison result.

A titling device provided by an embodiment of the present disclosure comprises an ID head, a PLC, a movement controlled chuck and a movement controlling unit for controlling the movement controlled chuck, wherein in the ID head, there is provided a real titling position determining unit, for determining a real titling position of a product to be titled that is carried on the movement controlled chuck; in the PLC, there is provided a comparison processing unit, for comparing the real titling position with a preset titling position, and outputting the comparison result to the movement controlling unit; the position of the movement controlled chuck is adjusted by the movement controlling unit according to the comparison result; and after the position of the movement controlled chuck is adjusted, the product to be titled that is carried on the movement controlled chuck is titled by the ID head.

A device for producing a liquid crystal display is also provided according to an embodiment of the present disclosure, and comprises the above described titling device.

BRIEF DESCRIPTION OF THE DRAWINGS

FIG. 5 is a schematic view of the coordinate values of the preset titling position in X direction and Y direction for 21 substrates according to an embodiment of the present disclosure; and FIG. 6 is a schematic view of the preset value, the real value, as well as the offset between the preset value and the real value in θ direction for 10 substrates according to an embodiment of the present disclosure.

DETAILED DESCRIPTION OF THE PREFERRED EMBODIMENTS

The embodiments of the present disclosure provide a method and a device for titling, which can achieve automatic correction when deviation occurs between a desired titling position of a product to be titled and a preset titling position, thereby avoiding an ID shift phenomenon, and thus ensuring accuracy of titling positions and improving titling efficiency.

Figure 2:
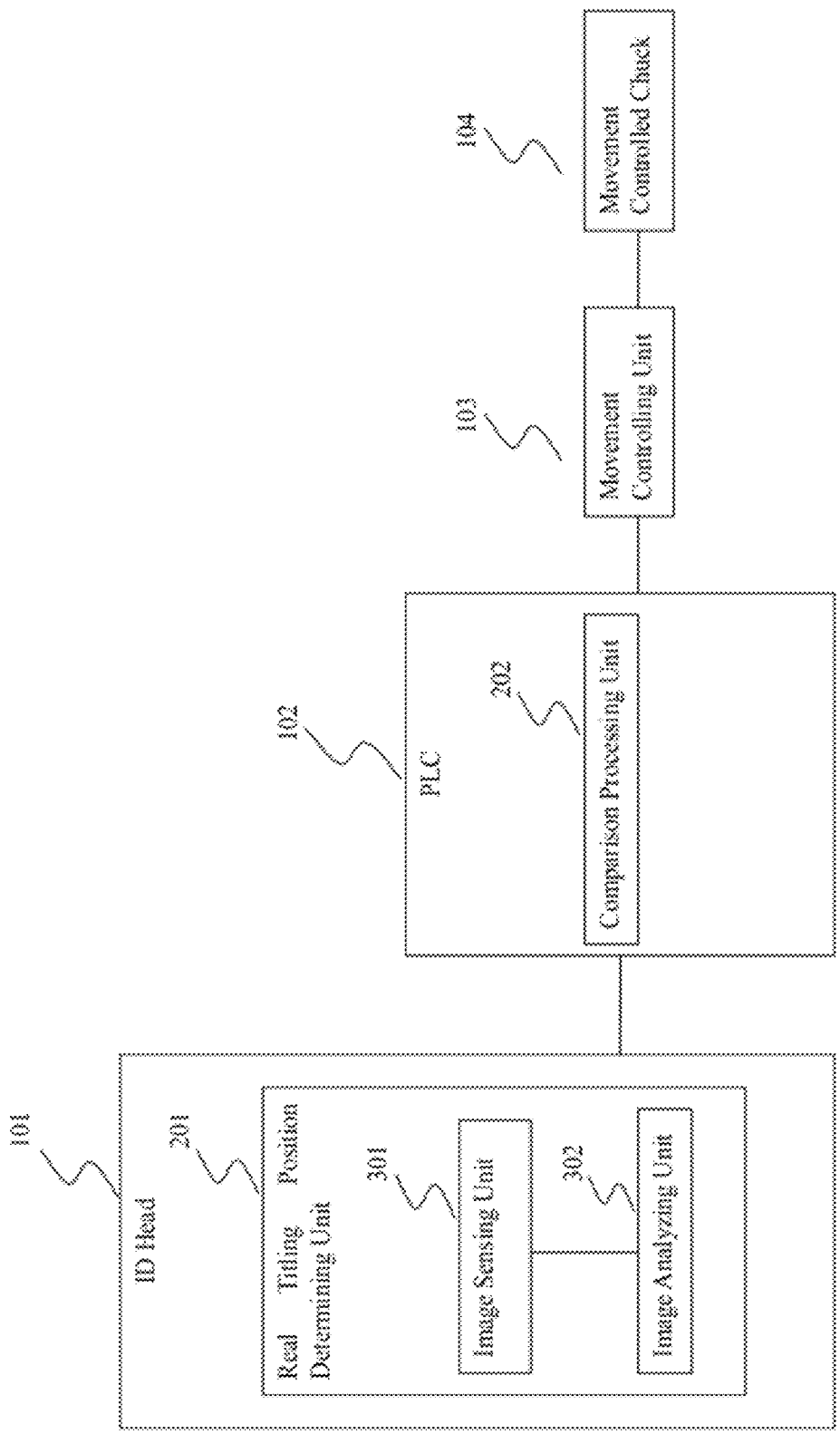
FIG. 2 is a schematic structural view of a titling device according to an embodiment of the present disclosure.

With reference to FIG. 2, an embodiment of the present disclosure provides a titling device, which comprises: an ID head 101, a Programmable Logic Controller (PLC) 102, a movement controlled chuck 104 and a movement controlling unit 103 for controlling the chuck 104. In the ID head 101, there is provided a real titling position determining unit 201 for determining a real titling position of a product to be titled. In the PLC 102, there is provided a comparison processing unit 202, for comparing the real titling position with a preset titling position, and outputting the comparison result to the movement controlling unit 103. The movement controlling unit 103 controls the position of the chuck 104 according to the comparison result. The ID head 101 performs titling on the product to be titled that is carried on the chuck 104.

Preferably, the real titling position determining unit 201 comprises an image sensing unit 301, optic fiber and an image analyzing unit 302. The image sensing unit 301 is used for determining an unexposed region of an ID pad region of a product to be titled. The image analyzing unit 302 is used for determining a center position of the ID pad region according to the unexposed region, wherein the center position is the real titling position of the product to be titled. The image sensing unit 301 and the image analyzing unit 302 are connected by the optical fiber.

In addition, the real titling position determining unit 201 may further comprise a lens.

The image sensing unit 301 may be a CCD or a CMOS.

Preferably, when the comparison processing unit 202 determines that the real titling position differs from the preset titling position, it further determines parameters for adjusting a titling device's chuck 104 positions, and sends the parameters to the movement controlling unit 103; the movement controlling unit 103 controls the chuck 104 to make a position adjustment according to the parameters; and after the adjustment, the ID head 101 titles the product to be titled that is carried on the chuck 104 according to the preset titling position.

Preferably, when the comparison processing unit 202 determines that the real titling position concurs with the preset titling position, it determines no position adjustment is needed for the chuck 104 of the titling device; and then the ID head 101 titles the product to be titled that is carried on the chuck 104 according to the preset titling position.

Preferably, the product to be titled is a substrate of a liquid crystal display.

The titling device provided by an embodiment of the present disclosure, has the same elements and structure as that of the prior art, except the real titling position determining unit 201 and the comparison processing unit 202 newly added in the embodiment of the present disclosure, and thus description of the same elements and structure is omitted here.

According to an embodiment of the present disclosure, a device for producing a liquid crystal display is further provided, which comprises the above described titling device.

It can be seen that, in the embodiments of the present disclosure, a real titling position determining unit 201 is installed additionally inside an ID head of the titling device for searching the cresol resin (PR adhesive)'s unexposed region in a product ID pad before titling, so as to determine the real titling position of the ID pad. After the real titling position of the ID pad is determined, the real titling position is sent to the comparison processing unit 202 in the PLC 102 through the optical fiber. The real titling position is compared with a preset titling position by the comparison processing unit 202, and then a glass substrate is titled in accordance with the comparison result. If the comparison result indicates a substrate shifting (glass shifting), then the comparison processing unit 202 determines parameters for position adjustment of the movement controlled chuck 104, and sends the parameters to the movement controlling unit 103, which in turn corrects the position of the chuck 104 according to the parameters. After the correction, the movement controlled chuck 104 is moved to a designated position, so that a product ID can be accurately titled in the center of the ID pad.

The real titling position determining unit 201 provided in the embodiments of the present disclosure mainly functions in two aspects: one is to distinguish boundary of an exposed region and an unexposed region of the cresol resin (PR adhesive) in a substrate's titling region; the other is to find out the unexposed region, calculate coordinate values of the center of the ID pad region, and send the values to the PLC through data lines.

After mechanically positioning the substrate and before titling begins, the titling device provided by the embodiments of the present disclosure, finds out the boundary of the unexposed region and calculates coordinate values of the center of the unexposed region by using the image sensing unit 301 to distinguish the boundary of the cresol resin (PR adhesive)'s exposed region and unexposed region in the product ID pad region. The center of the unexposed region is the center of the ID pad region. In one example of the embodiment of the present disclosure, the ID pad region is to be titled at the center thereof.

After finding out the product ID pad's real titling position (namely, the center position), the real titling position determining unit 201 will send the ID pad's real titling position data to the PLC. Then it is decided whether to make compensation to the chuck position according to the data calculated by the PLC. If deviation occurs between the ID pad region's real titling position and a preset titling position, then the PLC calculates the offset therebetween and obtains correcting values (namely, parameters for position adjustment of the movement controlled chuck 104 of the titling device). The correcting values are obtained on the basis of the preset titling position in such a way that the real titling position concurs with the preset titling position after the position adjustment of the chuck 104 in accordance with these correcting values, thereby the titling device titles on the real titling position of the product to be titled that is carried on the chuck after the adjustment, and thus accomplishing accurate titling.

The embodiments of the present disclosure improve the device's titling precision, effectively avoiding the ID shift phenomenon. Thus, mass production can be carried out, and no ID confirmation is needed, even when titling layer is required.

Figure 1:
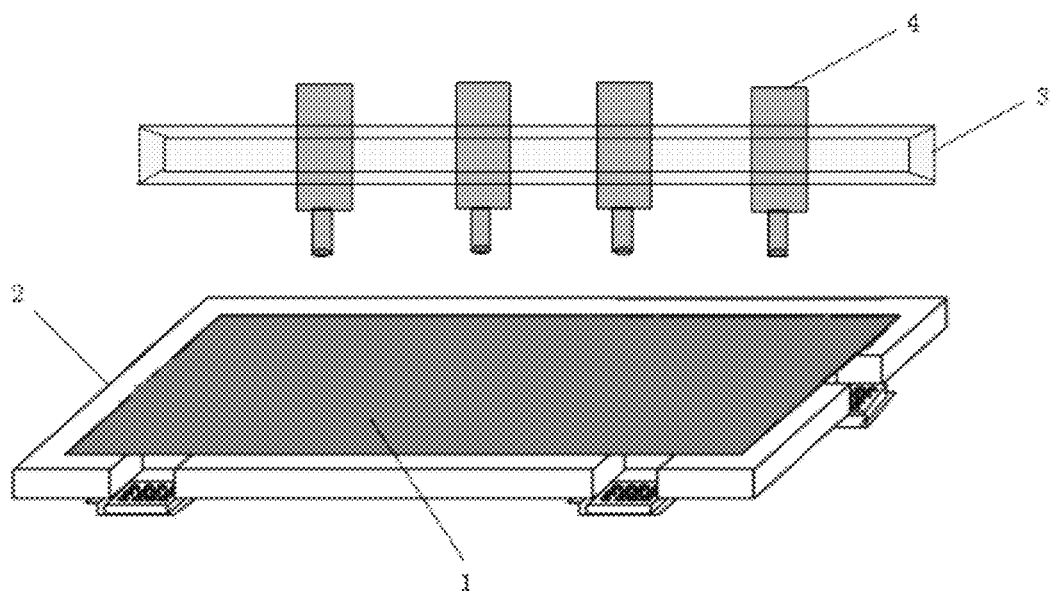
FIG. 1 is a schematic view of a titling device for titling a product to be titled of the prior art.
Figure 3:
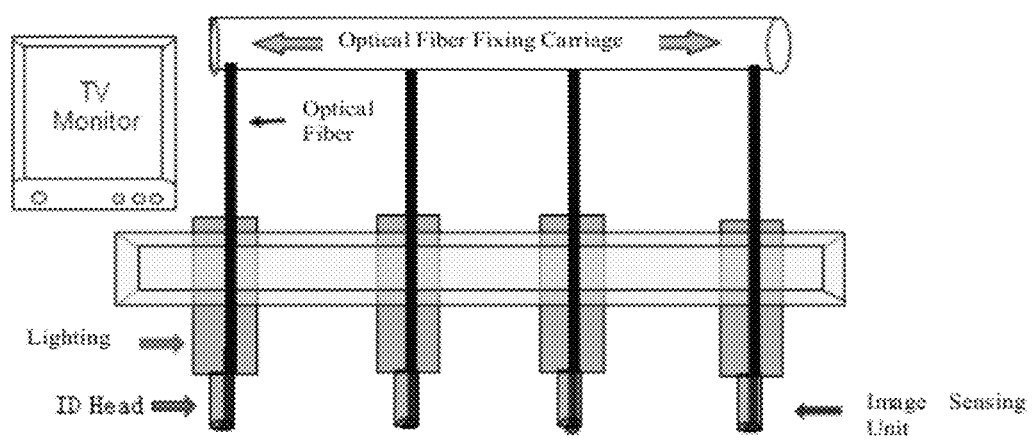
FIG. 3 is a schematic view of optic fiber and an image sensing unit provided in an ID head according to an embodiment of the present disclosure.

FIG. 3 is a schematic view of optic fiber and an image sensing unit provided inside an ID head according to an embodiment of the present disclosure. It can be seen by comparing FIG. 3 with FIG. 1, the image sensing unit inside the device's ID head is exactly used for precisely positioning the ID pad. After glass loading, three-point mechanical alignment is conducted; next, the image sensing unit firstly automatically distinguishes the boundary of the cresol resin (PR adhesive)'s exposed region and unexposed region in a product ID pad region according to a preset titling position; then the area of the unexposed region (ID pad region) is calculated, the boundary of the unexposed region is found out, and then the product ID pad's center position coordinate values are calculated and sent to the PLC through the optical fiber.

Figure 4:
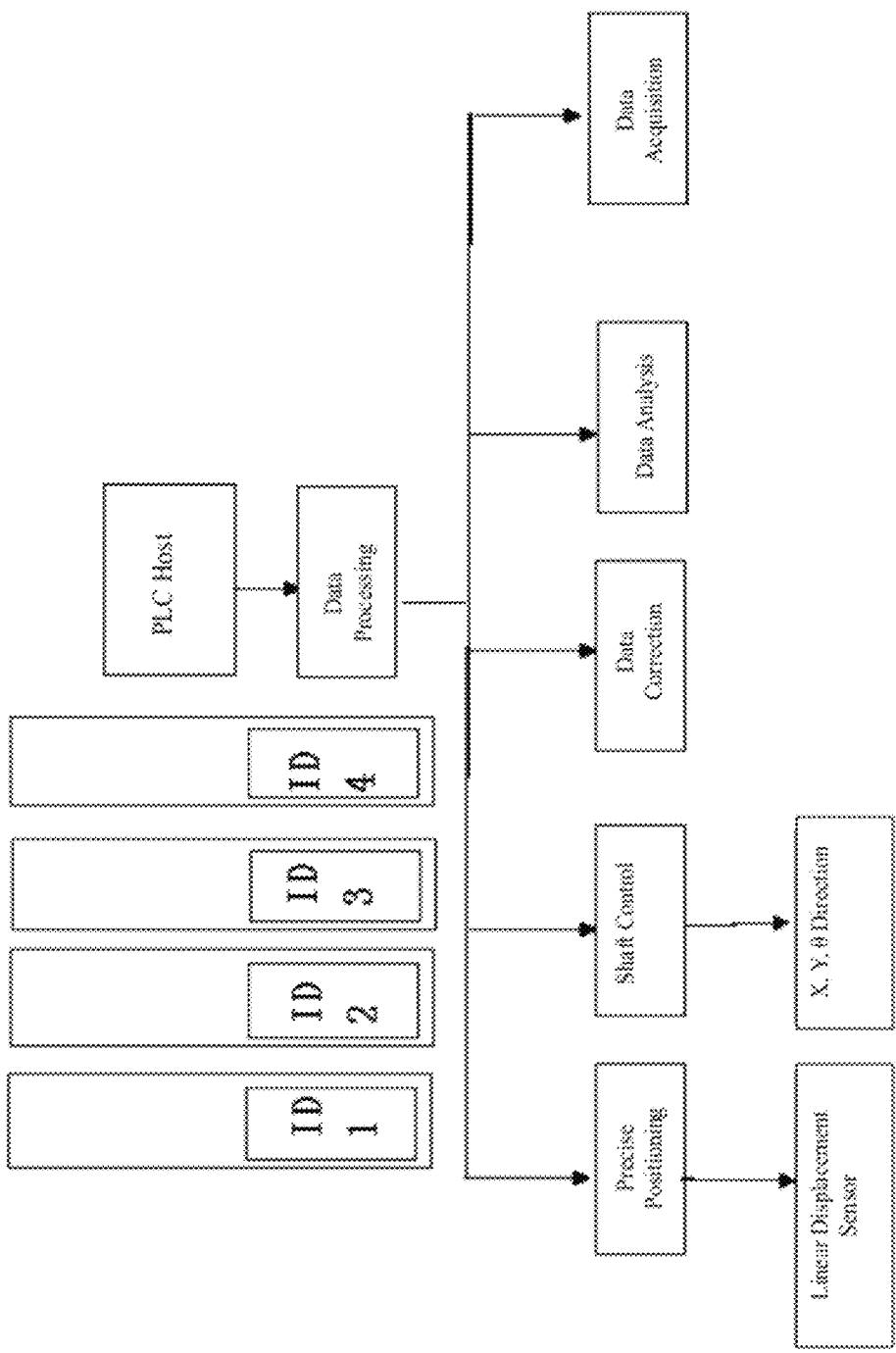
FIG. 4 is a schematic view of a PLC's operation principles according to an embodiment of the present disclosure.

With reference to FIG. 4, the PLC compares the ID pad's center position coordinate values uploaded by the image analyzing unit 302 with a preset titling position. The PLC will determine that the substrate has no deviation if the two data are identical. If the two data items are different, the PLC will calculate an offset for automatic compensation base on the uploaded data. The offset calculated and confirmed by the PLC will be automatically loaded by the PLC to the movement controlling unit 103. Thereafter, the movement controlling unit 103 sends out instructions so as to control the chuck to move to a new and correct titling point, and then the titling begins. Thus a whole set of titling compensation actions are accomplished. If the glass position has no deviation, the PLC will not change the parameters of the chuck of the titling device, and no correction will be conducted either. In this case, the chuck moves to an originally set position to start titling. Thus, it can be ensured that each ID on the glass is in the exact center of the ID pad. In FIG. 4, the data acquisition is to acquire the ID pad' center position coordinate values uploaded by the image analyzing unit 302; the data analysis is to compare the ID pad's center position coordinate values uploaded by the image analyzing unit 302 with a preset titling position; the data correction is to generate correcting values when the ID pad's center position coordinate values uploaded by the image analyzing unit 302 differs from the preset titling position value; the shaft control is to control the chuck positions according to the correcting values, including adjustment in X, Y and/or θ directions; the precise positioning is to accurately control the chuck to move through a linear displacement sensor which is equivalent to a switch for controlling the chuck's movement. In the figure, ID1, ID2, ID3, ID4 are the IDs titled on four substrates by the titling device.

In addition, the ID pad's center point position coordinates obtained through the PLC's calculation, as shown in FIG. 3, may be directly displayed on the ID pad TV monitor, which is connected with the ID head, thereby more intuitively displaying the titling ID positions, as well as the occurrence of an titling shifting.

For example, with reference to FIG. 5, it is assumed that there are 21 substrates, and the X coordinate and Y coordinate of each substrate's titling position is preset. Before titling each substrate, if the current substrate's X coordinate and Y coordinate which are actually measured by the real titling position determining unit 201 are different from the preset X coordinate and Y coordinate shown in FIG. 5, then the chuck carrying the current substrate is adjusted in X direction and Y direction according to the X coordinate and Y coordinate actually measured of the current substrate.

For adjustment in θ direction, for example, it is assumed that there are 10 substrates. As shown in FIG. 6, "Stand" represents a preset value, "Measure" represents an actually measured real value, "Diff" represents an offset between the preset value and the actually measured real value, "Camera 1", "Camera 2", "Camera 3" represent image sensing units used in a three-point mechanical positioning, respectively, with each image sensing unit corresponding to one value, and three values determining a substrate's θ direction, namely, the chuck's θ direction. As shown in FIG. 6, before titling each substrate, each substrate's θ direction is adjusted according to the "Diff" to which each image sensing unit corresponds.

In summary, in the embodiments of the present disclosure, by additionally installing a real titling position determining unit 201 inside an ID head of the device, the titling precision is improved. In production, after a glass substrate is loaded into the titling device, the image sensing unit 301 in the additionally installed real titling position determining unit 201 will automatically distinguish the boundary of the cresol resin (PR adhesive)'s exposed region and unexposed region in the product ID pad region, mainly judging based on the cresol resin (PR adhesive)'s photosensitive difference before and after exposure, so as to find out the boundary of the unexposed region and calculate the product ID pad's areal center position coordinate values. After the product ID pad's correct position is found out, the real titling position determining unit 201 will send the ID pad's current position data to the PLC, and then the PLC compares the data coordinates uploaded by the real titling position determining unit 201 with the recipe original coordinates (namely, preset titling position). If the two data are identical, the substrate is regarded as having no deviation. If the two data are different, the PLC will calculate an offset for automatic compensation based on the actually uploaded data, and then the PLC automatically loads the offset calculated and confirmed by the PLC to the movement controlling unit 103. Thereafter, the movement controlling unit 103 sends out instructions for moving the chuck to a correct titling point with new coordinates, and then the titling begins. Thus a whole set of titling compensation actions are accomplished.

By applying the technical solutions provided by the embodiments of the present disclosure, the product IDs can be titled at a time, with no need for a second titling. The traditional titling way will directly cause a product ID to be titled outside an ID pad due to a glass substrate's angle and position deviation in X, Y directions after being loaded into the titling device, which results in ID defects. The defective IDs would be cut in a subsequent cutting processing, with only a half left or totally disappeared, which makes the subsequent processing devices not able to automatically recognize a product ID. Consequently, a manual input of the product ID into the devices is needed, thus wasting a lot of manpower and the device's utilization. For example, the device can automatically streamline-detect 1000 pieces of display panels per hour, but if a product ID is cut and only be manually input inside the device, then the maximum is about 200 or less pieces of display panels per hour, and since the device is still running in idle while the manual inputting, thus causing lots of loss in human, material and financial resources.

The embodiments of the present disclosure further provide a titling method, which comprises steps as follows:

S101, determining a real titling position of a product to be titled;

S102, comparing the real titling position with a preset titling position;

S103, titling the product to be titled in accordance with the comparison result.

Preferably, the step of acquiring the real titling position of a product to be titled comprises:

determining an unexposed region of an ID pad region of a product to be titled; and determining the ID pad region's center position according to the unexposed region, the center position being the real titling position of the product to be titled.

preferably, the step of titling the product to be titled in accordance with the comparison result comprises:

when the real titling position differs from the preset titling position, determining parameters for adjusting a position of a movement controlled chuck of a titling device in such a way that the real titling position concurs with the preset titling position; and controlling the chuck to make a position adjustment according to the parameters, and after the adjustment, titling the product to be titled that is carried on the chuck according to the preset titling position.

Preferably, the step of titling the product to be titled in accordance with the comparison result further comprises:

when the real titling position concurs with the preset titling position, determining no position adjustment is needed for the movement controlled chuck of the titling device, and titling the product to be titled that is carried on the chuck according to the preset titling position.

To sum up, in the technical solutions provided by the embodiments of the present disclosure, a real titling position determining unit 201 is installed additionally inside an ID head of the titling device, so as to improve the titling precision. With application of this technology, ID shift will not occur, and production can be carried out without confirming product ID to devices. In production, after a glass substrate is put into the device, the device will automatically distinguish the boundary of the cresol resin (PR adhesive)'s exposed region and unexposed region in the product ID pad region according to designed coordinates, so as to find out the boundary of the unexposed region and calculate the product ID pad's center position coordinate values. After the product ID pad's correct position is found out, the real titling position determining unit 201 will send the ID pad's current position data to the PLC. Then, it is determined whether to make a position correction to the chuck of the titling device based on the data calculated by the PLC. The position correction will move the center position of the ID pad of the glass substrate carried on the movement controlled chuck 104 to the preset titling position. After the position correction, the titling is conduced. In this way, human, material and financial resources are saved.

It should be understood by the skilled in the art that the embodiments of the present disclosure may be implemented as methods, systems, or computer program products. Therefore, the present disclosure may be implemented as pure hardware, pure software, or a form of combed software and hardware. Moreover, the present disclosure may be in the form of computer program products implemented on one or more computer accessible storing media (including but not limited to disk storage and optical storage, etc.) containing computer accessible programming codes.

The present disclosure is described with reference to the flow charts and/or block diagrams of methods, devices (systems), and computer program products according to embodiments of the present disclosure. It should be understood that, each procedure and/or block in the flow charts and/or block diagrams, as well as the combination of the procedure and/or block in the flow charts and/or block diagrams can be realized with computer program instructions. These computer program instructions may be provided to a general computer, a dedicated computer, an embedded processor or other programmable data processing devices' processors to generate a machine, so that the instructions conducted by the computers or other programmable data processing devices' processors generate a device that is used for realizing functions designated in one or more procedures in the flow charts and/or one or more blocks in the block diagrams.

There computer program instructions may also be stored in a computer accessible storing medium which can lead a computer or other programmable data processing devices to operate in a particular way, so that the instructions stored in the computer readable storage generate an article comprising the instruction device. The instruction device realizes functions designated in one or more procedures in the flow charts and/or one or more blocks in the block diagrams.

There computer program instructions also may loaded to a computer or other programmable data processing devices, so that a series of operation steps are conducted on the computer or other programmable devices to produce a computer realized processing, thus the instructions conducted on the computer or other programmable devices provide steps that are used for realizing functions designated in one or more procedures in the flow charts and/or one or more blocks in the block diagrams.

Apparently, the skilled in art can make various changes and modifications to embodiments of the present disclosure without departing from the spirit and scope of the present disclosure. Therefore, so far as these changes and modifications fall in the scope of the claims and their equivalents of the present disclosure, these changes and modifications are intended to be comprised in the present disclosure.

What is claimed is:

1. A titling method, wherein the method comprises:
   determining a real titling position of a product to be titled;
   comparing the real titling position with a preset titling position;
   titling the product to be titled in accordance with the comparison result,
   wherein determining a real titling position of a product to be titled comprises;
   determining an unexposed region of an ID pad region of the product to be titled;
   determining a center position of the ID pad region according to the unexposed region, the center position being the real titling position of the product to be titled.

2. The method according to claim 1, wherein titling the product to be titled in accordance with the comparison result comprises:
   when the real titling position differs from the preset titling position, determining parameters for adjusting a position of a movement controlled chuck of a titling device, on which the product to be titled is carried, so as to make the real titling position concurs with the preset titling position;
   controlling the movement controlled chuck to make a position adjustment according to the parameters, and titling the product to be titled that is carried on the movement controlled chuck after the adjustment according to the preset titling position.

3. The method according to claim 2, wherein titling the product to be titled in accordance with the comparison result further comprises:
   when the real titling position concurs with the preset titling position, determining that no position adjustment is needed for the movement controlled chuck of the titling device, and titling the product to be titled that is carried on the movement controlled chuck according to the preset titling position.

4. A titling device, comprising an ID head, a PLC, a movement controlled chuck and a movement controlling unit for controlling the movement controlled chuck, wherein
   in the ID head, there is provided a real titling position determining unit, for determining a real titling position of a product to be titled that is carried on the movement controlled chuck;
   in the PLC, there is provided a comparison processing unit, for comparing the real titling position with a preset titling position, and outputting the comparison result to the movement controlling unit;
   the position of the movement controlled chuck is adjusted by the movement controlling unit according to the comparison result; and
   after the position of the movement controlled chuck is adjusted, the product to be titled that is carried on the movement controlled chuck is titled by the ID head,
   wherein the real titling position determining unit comprises an image sensing unit, optical fiber and an image analyzing unit;
   the image sensing unit is used for determining an unexposed region of an ID pad region of a product to be titled;
   the image analyzing unit is used for determining a center position of the ID pad region according to the unexposed region, the center position being the real titling position of the product to be titled; and
   the image sensing unit and the image analyzing unit are connected by the optical fiber.

5. The device according to claim 4, wherein when the comparison processing unit determines that the real titling position differs from the preset titling position, it further determines parameters for adjusting a position of the movement controlled chuck so as to make the real titling position concurs with the present titling position, and sends the parameters to the movement controlling unit;

the movement controlling unit controls the movement controlled chuck to make a position adjustment according to the parameters; and after the position adjustment, the ID head titles the product to be titled that is carried on the movement controlled chuck according to the preset titling position.

6. The device according to claim 5, wherein when the comparison processing unit determines that the real titling position concurs with the preset titling position, it determines no position adjustment is needed for the movement controlled chuck of the titling device; and the ID head titles the product to be titled that is carried on the movement controlled chuck according to the preset titling position.

7. The device according to claim 4, wherein the product to be titled is a substrate of a liquid crystal display.

8. A device for producing a liquid crystal display, wherein the device comprises a titling device according to claim 4.

* * * * *